US012725647B2

(12) United States Patent
Noh et al.

(10) Patent No.: US 12,725,647 B2
(45) Date of Patent: Sep. 1, 2026

(54) SEMICONDUCTOR DEVICE AND MEMORY DEVICE INCLUDING SAMPLING CIRCUIT

(71) Applicant: SK hynix Inc., Gyeonggi-do (KR)

(72) Inventors: Hyeon Woo Noh, Gyeonggi-do (KR); Kwang Soo Kim, Gyeonggi-do (KR); Woongrae Kim, Gyeonggi-do (KR); Hyung Min Kim, Gyeonggi-do (KR); Jun Seok Noh, Gyeonggi-do (KR)

(73) Assignee: SK hynix Inc., Gyeong3gi-do (KR)

( * ) Notice: Subject to any disclaimer, the term of this patent is extended or adjusted under 35 U.S.C. 154(b) by 181 days.

(21) Appl. No.: 18/581,376

(22) Filed: Feb. 20, 2024

(65) Prior Publication Data

US 2025/0140299 A1 May 1, 2025

(30) Foreign Application Priority Data

Oct. 31, 2023 (KR) ........................ 10-2023-0147662

(51) Int. Cl.
*G11C 11/406* (2006.01)

(52) U.S. Cl.
CPC .................................. *G11C 11/406* (2013.01)

(58) Field of Classification Search
CPC .... G11C 11/406; G11C 11/40611; G11C 7/00
USPC .......................................................... 365/222
See application file for complete search history.

(56) References Cited

U.S. PATENT DOCUMENTS 11,615,829 B1 3/2023 Kim et al.
11,631,448 B1 4/2023 Lee et al.
2023/0178137 A1* 6/2023 Kim ................. G11C 11/40615 365/222
2023/0420011 A1* 12/2023 Noh ........................ G11C 7/20

FOREIGN PATENT DOCUMENTS

KR 10-2022-0084955 A 6/2022
KR 10-2023-0083929 A 6/2023

* cited by examiner

*Primary Examiner* — Connie C Yoha
(74) *Attorney, Agent, or Firm* — IP & T GROUP LLP

(57) ABSTRACT

A semiconductor device includes: a sampling control circuit configured to select a coarse section from a plurality of coarse sections according to a first pattern signal during a sampling period, select a fine section from a plurality of fine sections according to a second pattern signal during the selected coarse section, and generate first to third sampling control signals having activated sections defined by the selected coarse section and the selected fine section; and a sampling circuit configured to sample an input address according to the first to third sampling control signals, respectively, to generate first to third sampling addresses, and schedule the first to third sampling addresses according to a sampling signal defining the sampling period to output an output address.

16 Claims, 12 Drawing Sheets

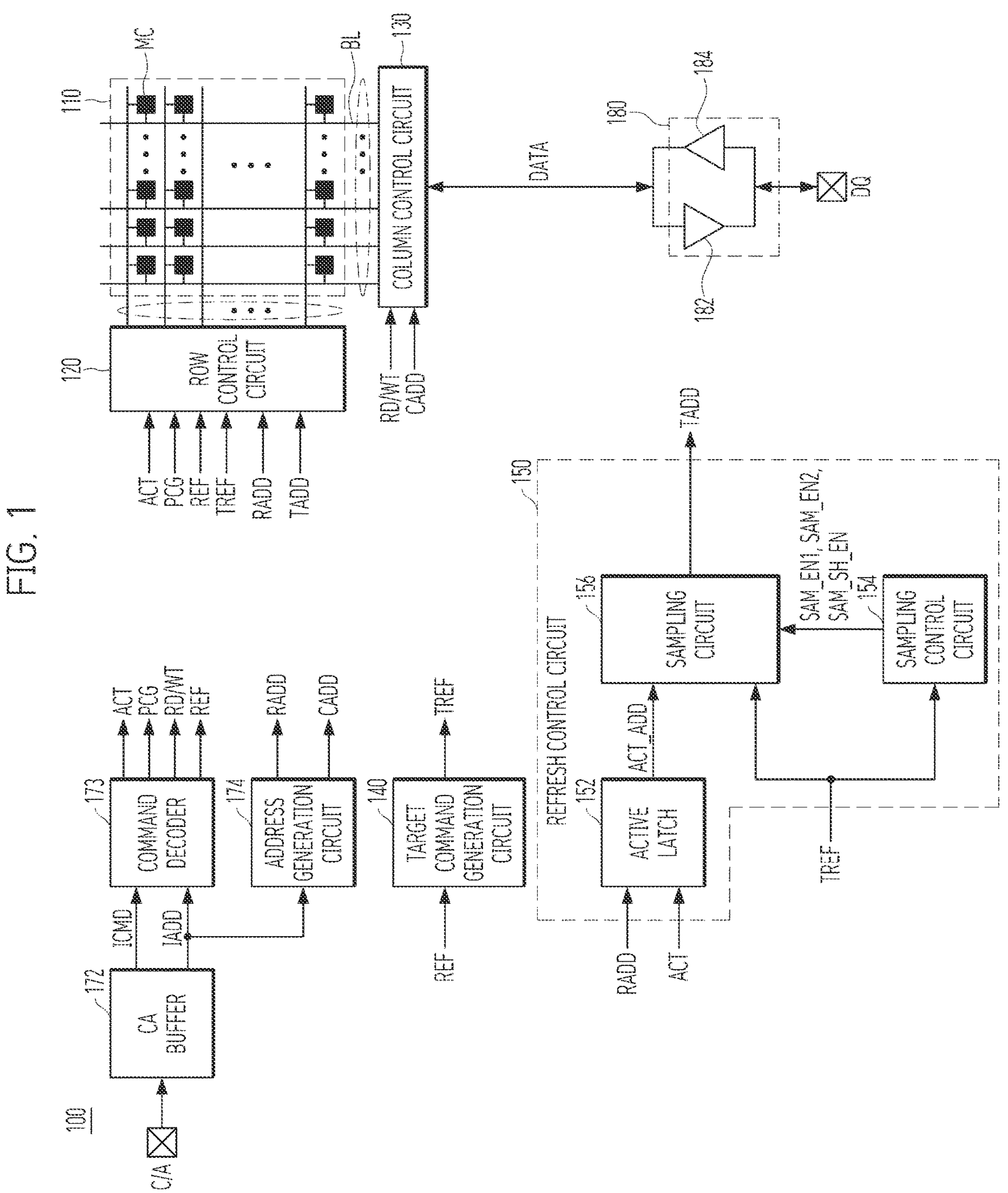
FIG. 1
100
C/A
172
CA BUFFER
ICMD
IADD
173
COMMAND DECODER
ACT
PCG
RD/WT
REF
174
ADDRESS GENERATION CIRCUIT
RADD
CADD
140
TARGET COMMAND GENERATION CIRCUIT
REF
TREF
150
REFRESH CONTROL CIRCUIT
152
ACTIVE LATCH
RADD
ACT
ACT_ADD
156
SAMPLING CIRCUIT
154
SAMPLING CONTROL CIRCUIT
SAM_EN1, SAM_EN2, SAM_SH_EN
TREF
TADD
120
ROW CONTROL CIRCUIT
ACT
PCG
REF
TREF
RADD
TADD
110
MC
BL
130
COLUMN CONTROL CIRCUIT
RD/WT
CADD
DATA
180
182
184
DQ 154
156
TREF
210
FIRST PATTERN GENERATION CIRCUIT
220
SECOND PATTERN GENERATION CIRCUIT
SOUT1
SOUT2
230
FIRST SECTION CONTROL CIRCUIT
240
SECOND SECTION CONTROL CIRCUIT
HIT1
HIT2
250
CONTROL SIGNAL GENERATION CIRCUIT
SAM_EN1
SAM_SH_EN
SAM_EN2
ACT_ADD
310
FIRST STORAGE CIRCUIT
330
SHADOW LATCH
320
SECOND STORAGE CIRCUIT
SAM_ADD1
L_IN1
SH_ADD
L_OUT3
SAM_ADD2
L_IN2
340
OUTPUT CONTROL CIRCUIT
TADD

FIG. 4 tSP
tCOARSE
tFINE
TREF
@210
SOUT1
S_CNT1
HIT1
@220
SOUT2
S_CNT2
HIT2
SAM_EN1
SAM_EN2
SAM_SH_EN

310
ACT_ADD
SAM_ADD1
PIN1
POUT1
PIN2
POUT2
PIN3
POUT3
PIN4
POUT4
ADD_L1
ADD_L2
ADD_L3
ADD_L4
C1
C2
C3
C4
LADD1
LADD2
LADD3
LADD4
R1, M1
R2, M2
R3, M3
R4, M4
CNT1
CNT2
CNT3
CNT4
312
L_IN1
LATCH CONTROL CIRCUIT
SAM_EN1
ACT_ADD
PIN1~PIN4, POUT1~POUT4

500
C/A
572
CA BUFFER
ICMD
IADD
573
COMMAND DECODER
ACT
PCG
RD/WT
REF
RFM
574
ADDRESS GENERATION CIRCUIT
RADD
CADD
540
TARGET COMMAND GENERATION CIRCUIT
REF
TREF
550
552
ACTIVE LATCH
RADD
ACT
ACT_ADD
RFM
TREF
556
SAMPLING CIRCUIT
554
SAMPLING CONTROL CIRCUIT
SAM_EN1, SAM_EN2,
SAM_SH_EN
TADD
520
ROW CONTROL CIRCUIT
ACT
PCG
REF
TREF
RFM
RADD
TADD
510
MC
BL
530
COLUMN CONTROL CIRCUIT
RD/WT
CADD
DATA
580
DQ

SEMICONDUCTOR DEVICE AND MEMORY DEVICE INCLUDING SAMPLING CIRCUIT

CROSS-REFERENCE TO RELATED APPLICATION

The present application claims the benefit of Korean Patent Application No. 10-2023-0147662, filed on Oct. 31, 2023, which is incorporated herein by reference in its entirety.

BACKGROUND

1. Field

Various embodiments of the present disclosure relate to a semiconductor design technology, and more particularly, to a semiconductor device and a memory device including a sampling circuit that randomly samples input signals.

2. Description of the Related Art

Recently, in addition to a normal refresh operation, an additional refresh operation which will be, hereinafter, referred to as a 'target refresh operation', is performed on the memory cells coupled to a specific word line that is likely to lose data due to row hammering phenomenon. The row hammering phenomenon refers to a phenomenon in which data of memory cells coupled to a specific word line or adjacent word lines disposed adjacent to the specific word line are damaged due to a high number of activations of the specific word line. In order to prevent the row hammering phenomenon, a target refresh operation is performed on a word line that is activated more than a predetermined number of times, and adjacent word lines disposed adjacent to the word line.

In the target refresh operation, word lines on which the target refresh operation is to be performed may be selected by randomly sampling addresses based on probability. Accordingly, research on a sampling circuit for randomly sampling addresses has been conducted.

SUMMARY

Embodiments of the present disclosure are directed to a semiconductor device and a memory device including a sampling circuit capable of randomly sampling addresses.

According to an embodiment of the present disclosure, a semiconductor device includes a sampling control circuit configured to select a coarse section from a plurality of coarse sections according to a first pattern signal during a sampling period, select a fine section from a plurality of fine sections according to a second pattern signal during the selected coarse section, and generate first to third sampling control signals having activated sections defined by the selected coarse section and the selected fine section; and a sampling circuit configured to sample an input address according to the first to third sampling control signals, respectively, to generate first to third sampling addresses, and schedule the first to third sampling addresses according to a sampling signal defining the sampling period to output an output address.

According to an embodiment of the present disclosure, a semiconductor device includes a sampling control circuit configured to generate a first pattern signal and a second pattern signal, which randomly pulse at different periods according to a sampling signal, and generate first to third sampling control signals based on the first pattern signal and the second pattern signal; a first storage circuit configured to store an input address as one of a plurality of first preliminary addresses according to the first sampling control signal to generate a first sampling address; a second storage circuit configured to store the input address as one of a plurality of second preliminary addresses according to the second sampling control signal to generate a second sampling address; a shadow latch configured to latch the input address as a third sampling address according to the third sampling control signal; and an output control circuit configured to output an output address by selecting one of the first to third sampling addresses according to the sampling signal.

According to an embodiment of the present disclosure, a memory device includes a refresh control circuit configured to select a coarse section from a plurality of coarse sections according to a first pattern signal during a target refresh period, select a fine section from a plurality of fine sections according to a second pattern signal during the selected coarse section, generate first to third sampling control signals having activated sections defined by the selected coarse section and the selected fine section, and sample an active address according to the first to third sampling control signals to output a target address; and a row control circuit configured to refresh at least one row corresponding to the target address according to a target refresh command defining the target refresh period.

Further, according to embodiments of the present disclosure, the semiconductor device may maximize the randomization by enabling sampling for an entire range of the sampling section. Further, the semiconductor device may address periodicity of the sampling circuit by performing sampling using dual pattern generation circuits operating at different periods/cycles.

In addition, according to embodiments of the present disclosure, the semiconductor device may maximize accuracy of address sampling and improve efficiency of a target refresh operation by applying a sampling circuit to a memory device performing a target refresh operation by sampling addresses based on probability.

BRIEF DESCRIPTION OF THE DRAWINGS

FIG. 1 is a block diagram illustrating a memory device in accordance with an embodiment of the present disclosure.

FIG. 4 is a timing diagram for describing an operation of the sampling control circuit in accordance with an embodiment of the present disclosure.

DETAILED DESCRIPTION

Figure 2:
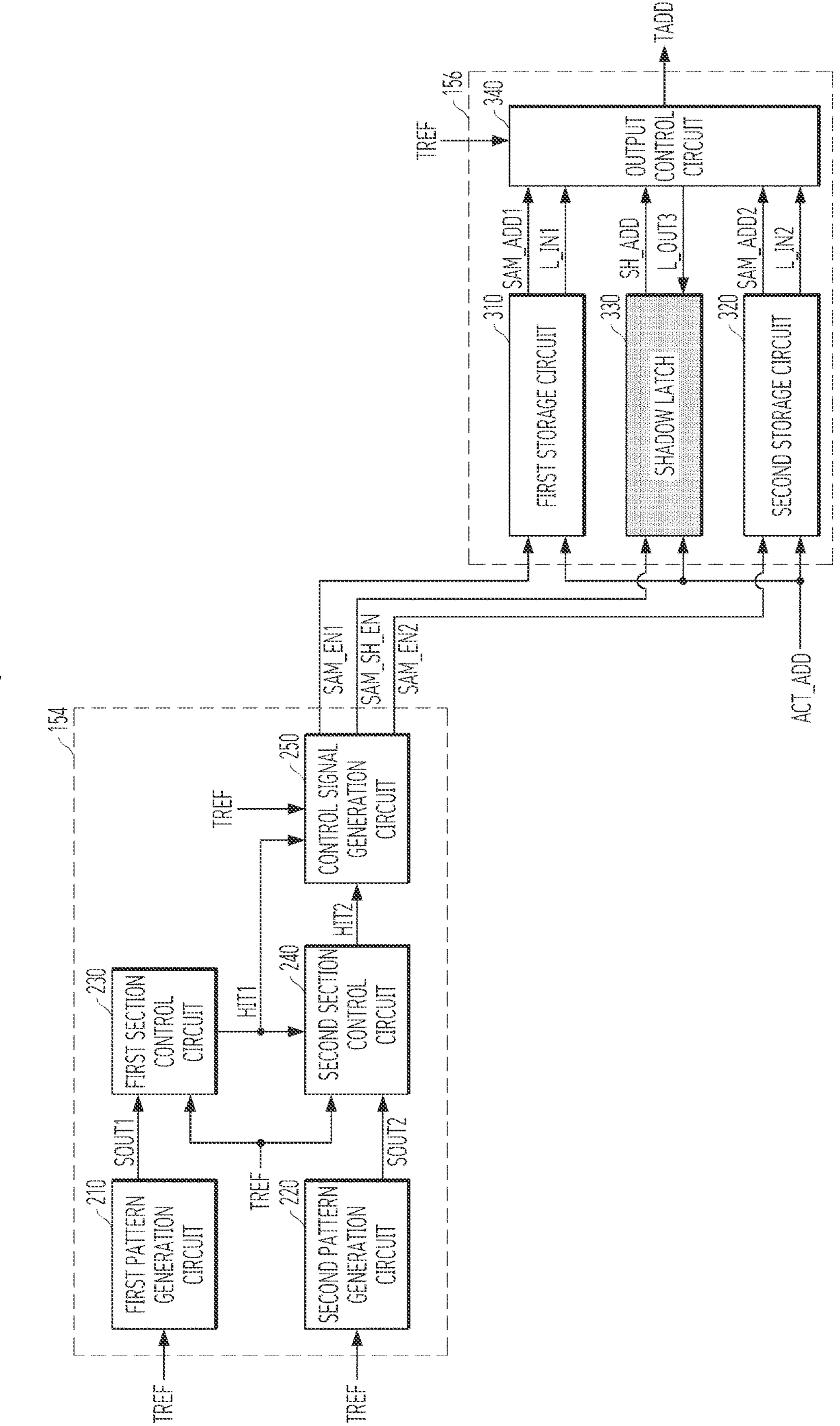
FIG. 2 is a diagram illustrating a detailed configuration of a sampling control circuit and a sampling circuit of FIG. 1, in accordance with an embodiment of the present disclosure.

Various embodiments of the present disclosure will be described below in more detail with reference to the accompanying drawings. The embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, a memory device is described as a semiconductor device including a sampling circuit. However, the embodiments of the present disclosure are not limited thereto, and may be applied to all semiconductor devices including a sampling circuit for randomly sampling an input address or input signals.

FIG. 1 is a block diagram illustrating a memory device 100 in accordance with an embodiment of the present disclosure.

Referring to FIG. 1, the memory device 100 may include a memory cell region 110, a row control circuit 120, a column control circuit 130, a target command generation circuit 140, a refresh control circuit 150, a command/address (CA) buffer 172, a command decoder 173, an address generation circuit 174, and a data input/output circuit 180.

The memory cell region 110 may include a plurality of memory cells MC respectively coupled to a plurality of word lines WL (hereinafter referred to as "a plurality of rows WL") and a plurality of bit lines BL (hereinafter referred to as "a plurality of columns BL"). The plurality of rows WL may extend in a first direction (e.g., a row direction) and may be sequentially disposed in a second direction (e.g., a column direction) perpendicular to the first direction. The plurality of columns BL may extend in the column direction and may be sequentially disposed in the row direction. The plurality of memory cells MC may be composed of memory cells that require a refresh operation to secure data retention time. The memory cell region 110 may be composed of at least one bank. The number of banks or the number of memory cells MC and RHC may be determined depending on the capacity of the memory device 100.

The CA buffer 172 may receive a command/address signal C/A from an external device (e.g., a memory controller). The CA buffer 172 may buffer the command/address signal C/A to output an internal command ICMD and an internal address IADD.

The command decoder 173 may decode the internal command ICMD output from the CA buffer 172 to generate an active command ACT, a precharge command PCG, a read command RD, and a write command WT. Further, the command decoder 173 may decode the internal command ICMD to generate a normal refresh command REF which is periodically activated.

The address generation circuit 174 may classify the internal address IADD received from the CA buffer 172 as a row address RADD and a column address CADD. Depending on an embodiment, the address generation circuit 174 may interpret some bits of the internal address IADD as a row address RADD and interpret the remaining bits as a column address CADD. The address generation circuit 174 may determine the internal address IADD as a row address RADD when an active operation is directed as a result of the decoding by the command decoder 173 and determine the internal address IADD as a column address CADD when a read or write operation is directed by the command decoder 173. The plurality of rows WL may be accessed according to the row address RADD, and the plurality of columns BL may be accessed according to the column address CADD.

The target command generation circuit 140 may generate a target refresh command TREF based on the normal refresh command REF. For example, the target command generation circuit 140 may generate the target refresh command TREF whenever the number of inputs of the normal refresh command REF reaches a preset number of times or reaches a preset condition. A target refresh period, which will be described below, may be determined by the target refresh command TREF, and one target refresh period may be defined as a period between adjacent target refresh commands TREF.

The refresh control circuit 150 may generate first to third sampling control signals SAM_EN1, SAM_EN2, and SAM_ SH_EN, which are randomly activated during the target refresh period. The refresh control circuit 150 may latch the row address RADD in response to the active command ACT to output an active address ADD_ACT, and store a plurality of sampling addresses by randomly sampling the active addresses ADD_ACT in response to the first to third sampling control signals SAM_EN1, SAM_EN2, and SAM_SH_EN. The refresh control circuit 150 may output a target address TADD by selecting one of the plurality of sampling addresses according to the target refresh command TREF.

In detail, the refresh control circuit 150 may include an active latch 152, a sampling control circuit 154, and a sampling circuit 156.

The active latch 152 may latch the internal address IADD in response to the active command ACT and output as the active address ADD_ACT.

The sampling control circuit 154 may include at least two pattern generation circuits having different operation periods to generate a first pattern signal and a second pattern signal, which randomly pulse at different periods during the target refresh period. The sampling control circuit 154 may randomly select one of a plurality of coarse sections according to the first pattern signal during the target refresh period, and randomly select one of a plurality of fine sections according to the second pattern signal during the selected coarse section. The sampling control circuit 154 may generate the first to third sampling control signals SAM_EN1, SAM_EN2, and SAM_SH_EN having activated sections defined by the selected coarse section and the selected fine section. The sampling control circuit 154 may generate the first sampling control signal SAM_EN1 and the second sampling control signal SAM_EN2 having activated sections distinguished from each other by the selected fine section during the target refresh period, and the third sampling control signal SAM_SH_EN having an activated section defined by the selected coarse section.

The sampling circuit 156 may store first to third sampling addresses by sampling the active addresses ADD_ACT according to the first to third sampling control signals SAM_EN1, SAM_EN2, and SAM_SH_EN, respectively, and output the target address TADD by scheduling the first to third sampling addresses according to the target refresh command TREF. According to an embodiment, the sampling circuit 156 may calculate adjacent addresses using the sampling addresses to output the calculated adjacent addresses as the target address TADD.

The row control circuit 120 may be coupled to the plurality of memory cells MC of the memory cell region 110 through the plurality of rows WL. The row control circuit 120 may select or activate at least one row selected by the row address RADD when the active command ACT is input and deactivate the activated row when the precharge command PCG is input. In order to select a row to be refreshed during a normal refresh operation, a refresh counter (not shown) for generating a counted address that sequentially increases according to the normal refresh command REF may be additionally provided. The row control circuit 120 may perform a normal refresh operation of sequentially refreshing the plurality of rows WL corresponding to the counted address according to the normal refresh command REF. The row control circuit 120 may perform a target refresh operation of refreshing at least one adjacent row corresponding to the target address TADD according to the target refresh command TREF.

The column control circuit 130 may be coupled to the plurality of memory cells MC of the memory cell region 110 through the plurality of columns BL. The column control circuit 130 may select some columns among the columns BL, according to the column address CADD, read internal data DATA from the memory cells MC through the selected columns according to the read command RD, and write internal data DATA provided through the data input/output circuit 180 to the memory cells MC through the selected columns according to the write command WT. The column control circuit 130 may be coupled to a data pad through the data input/output circuit 180 to transmit and receive data DQ to and from the memory controller.

The data input/output circuit 180 may be coupled between the column control circuit 130 and the data pad to transmit and receive the internal data DATA to and from the memory controller. The data input/output circuit 180 may include a data output circuit 182 and a data input circuit 184. The data output circuit 182 may output the internal data DATA read from the memory cell region 110 to the data pad. The data input circuit 184 may receive the internal data DATA provided from the memory controller through the data pad.

Hereinafter, detailed configurations and operations of the sampling control circuit 154 and the sampling circuit 156 according to an embodiment of the present disclosure will be described with reference to the drawings.

FIG. 2 is a diagram illustrating a detailed configuration of the sampling control circuit 154 and the sampling circuit 156 of FIG. 1, in accordance with an embodiment of the present disclosure.

Referring to FIG. 2, the sampling control circuit 154 may include at least two pattern generation circuits 210 and 220 having different operation periods to generate a first pattern signal SOUT1 and a second pattern signal SOUT2, which randomly pulse at different periods during the target refresh period. The sampling control circuit 154 may generate the first to third sampling control signals SAM_EN1, SAM_EN2, and SAM_SH_EN based on the first pattern signal SOUT1 and the second pattern signal SOUT2. The target refresh period may be determined by the target refresh command TREF, and one target refresh period may be defined as a period between adjacent target refresh commands TREF. In the case of a semiconductor device, the target refresh period may be defined as a sampling period, and the target refresh command TREF may be defined as a sampling signal. Further, one sampling period may be defined as a period between adjacent sampling signals.

The sampling control circuit 154 may include a first pattern generation circuit 210, a second pattern generation circuit 220, a first section control circuit 230, a second section control circuit 240, and a control signal generation circuit 250.

The first pattern generation circuit 210 may generate the first pattern signal SOUT1 that randomly pulses during the target refresh period. The first pattern generation circuit 210 may operate based on the target refresh command TREF. The first pattern generation circuit 210 may divide the target refresh period into a plurality of coarse sections and generate the first pattern signal SOUT1 that pulses for each coarse section. Each of the plurality of coarse sections may have a random period (or length).

The second pattern generation circuit 220 may generate the second pattern signal SOUT2 that randomly pulses during the target refresh period. The second pattern generation circuit 220 may operate based on the target refresh command TREF. The second pattern generation circuit 220 may divide the target refresh period into a plurality of fine sections and generate the second pattern signal SOUT2 that pulses for each fine section. Each of the plurality of fine sections has a random period, and may have a shorter period than each of the plurality of coarse sections. That is, the second pattern generation circuit 220 may operate in a period shorter than the first pattern generation circuit 210 to generate the second pattern signal SOUT2 that randomly pulses in a section shorter than the first pattern signal SOUT1.

Each of the first pattern generation circuit 210 and the second pattern generation circuit 220 may be implemented with a pseudo-random binary sequence (PRBS) based random pattern generator, or a linear feedback shift register (LFSR) based random pattern generator. For example, the first pattern generation circuit 210 and the second pattern generation circuit 220 may be implemented with the PRBS based random pattern generator. In this case, the first pattern generation circuit 210 and the second pattern generation circuit 220 may be implemented as a uniform random number sequence generator capable of generating pattern signals randomly pulsing the same number of times within a specific period rather than a round robin method.

The first section control circuit 230 may randomly select one coarse section from the plurality of coarse sections, according to the target refresh command TREF and the first pattern signal SOUT1, and generate a coarse section signal HIT1 for designating the selected coarse section. For example, the coarse section signal HIT1 may be a signal having a logic high level during the selected coarse section. According to an embodiment, the first section control circuit 230 may generate a reference count value by counting the number of inputs of the target refresh command TREF, and generate a first count value by counting the number of toggling of the first pattern signal SOUT1, and generate the coarse section signal HIT1 by comparing the reference count value with the first count value. The coarse section signal HIT1 may be activated when the first count value matches the reference count value.

The second section control circuit 240 may randomly select one fine section from the plurality of fine sections, according to the target refresh command TREF and the second pattern signal SOUT2 during the selected coarse section, and generate a fine section signal HIT2 for designating the selected fine section. For example, the fine section signal HIT2 may be a signal having a logic high level during the selected fine section. According to an embodiment, the second section control circuit 240 may generate a second count value by counting the number of toggling of the second pattern signal SOUT2, and generate the fine section signal HIT2 by comparing the reference count value with the second count value. The fine section signal HIT2 may be activated when the second count value matches the reference count value.

The control signal generation circuit 250 may generate the first sampling control signal SAM_EN1 and the second sampling control signal SAM_EN2 having activated sections distinguished from each other by the selected fine section during the target refresh period. In addition, the control signal generation circuit 250 may generate the third sampling control signal SAM_SH_EN having an activated section defined by the selected coarse section during the target refresh period.

The sampling circuit 156 may sample the active addresses ADD_ACT according to the first to third sampling control signals SAM_EN1, SAM_EN2, and SAM_SH_EN, respectively, to generate first to third sampling addresses SAM_ADD1, SAM_ADD2, and SH_ADD. The sampling circuit 156 may schedule the first to third sampling addresses SAM_ADD1, SAM_ADD2, and SH_ADD according to the target refresh command TREF to output the target address TADD.

The sampling circuit 156 may include a first storage circuit 310, a second storage circuit 320, a shadow latch 330, and an output control circuit 340.

The first storage circuit 310 may receive and store the active address ACT_ADD as a plurality of first preliminary addresses according to the first sampling control signal SAM_EN1, and output the first sampling address SAM_ADD1 by selecting one of the first preliminary addresses based on the number of inputs (or storages) of the first preliminary addresses. The first storage circuit 310 may provide a first input control signal L_IN1 together with the first sampling address SAM_ADD1. That is, the first input control signal L_IN1 may be a signal indicating that the first sampling address SAM_ADD1 is valid data.

The second storage circuit 320 may receive and store the active address ACT_ADD as a plurality of second preliminary addresses according to the second sampling control signal SAM_EN2, and output the second sampling address SAM_ADD2 by selecting one of the second preliminary addresses based on the number of inputs (or storages) of the second preliminary addresses. The second storage circuit 320 may provide a second input control signal L_IN2 together with the second sampling address SAM_ADD2. That is, the second input control signal L_IN2 may be a signal indicating that the second sampling address SAM_ADD2 is valid data.

The shadow latch 330 may latch the active address ACT_ADD according to the third sampling control signal SAM_SH_EN, to output the third sampling address SH_ADD according to a third output control signal L_OUT3 provided from the output control circuit 340 as the third sampling address SH_ADD.

The output control circuit 340 may output the target address TADD by scheduling the first to third sampling addresses SAM_ADD1, SAM_ADD2, and SH_ADD according to the target refresh command TREF. The output control circuit 340 may receive the first sampling address SAM_ADD1 according to the first input control signal L_IN1, and the second sampling address SAM_ADD2 according to the second input control signal L_IN2. In addition, the output control circuit 340 may provide the third output control signal L_OUT3 to the shadow latch 330 in order to receive the third sampling address SH_ADD from the shadow latch 330.

Hereinafter, referring to FIGS. 3 and 4, a detailed configuration and operation of each component of the sampling control circuit 154 will be described.

Figure 3:
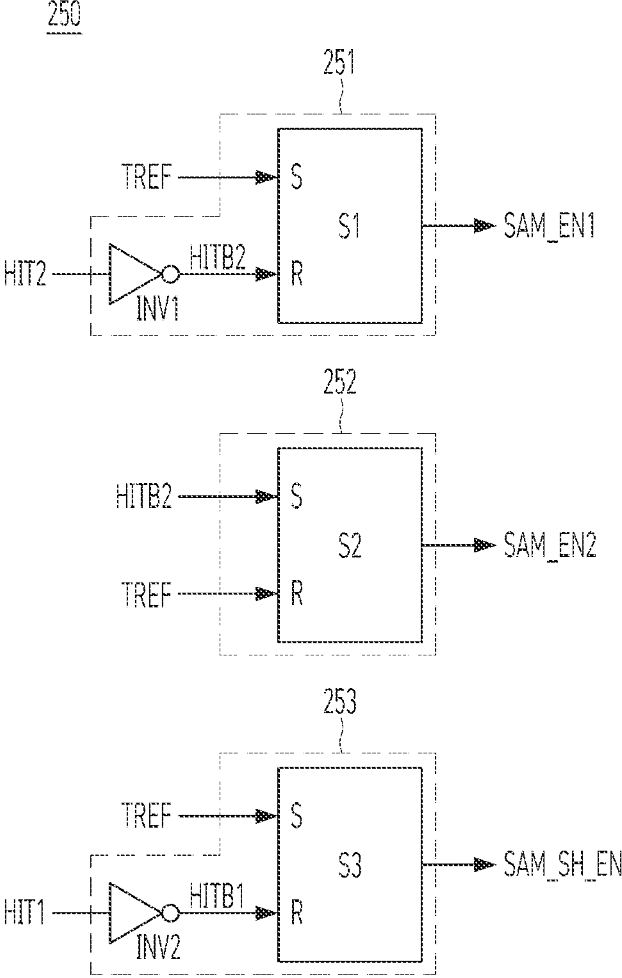
FIG. 3 is a diagram illustrating a detailed configuration of a control signal generation circuit of FIG. 2, in accordance with an embodiment of the present disclosure.

FIG. 3 is a diagram illustrating a detailed configuration of the control signal generation circuit 250 of FIG. 2, in accordance with an embodiment of the present disclosure.

Referring to FIG. 3, the control signal generation circuit 250 may include first to third signal generators 251 to 253.

The first signal generator 251 may include a first inverter INV1 and a first SR latch S1. The first inverter INV1 may invert the fine section signal HIT2 to output an inverted fine section signal HITB2. The first SR latch S1 may output the first sampling control signal SAM_EN1 that is set according to the target refresh command TREF and reset according to the inverted fine section signal HITB2. As a result, the first signal generator 251 may generate the first sampling control signal SAM_EN1 that becomes a logic high level according to a rising edge of the target refresh command TREF and becomes a logic low level according to a falling edge of the fine section signal HIT2.

The second signal generator 252 may include a second SR latch S2. The second SR latch S2 may output the second sampling control signal SAM_EN2 that is set according to the inverted fine section signal HITB2 and reset according to the target refresh command TREF. As a result, the second signal generator 252 may generate the second sampling control signal SAM_EN2 that becomes a logic high level according to the falling edge of the fine section signal HIT2 and becomes a logic low level according to the rising edge of the target refresh command TREF.

The third signal generator 253 may include a second inverter INV2 and a third SR latch S3. The second inverter INV2 may invert the coarse section signal HIT1 to output an inverted coarse section signal HITB1. The third SR latch S3 may output the third sampling control signal SAM_SH_EN that is set according to the target refresh command TREF and reset according to the inverted coarse section signal HITB1. As a result, the third signal generator 253 may generate the third sampling control signal SAM_SH_EN that becomes a logic high level according to the rising edge of the target refresh command TREF and becomes a logic low level according to a falling edge of the coarse section signal HIT1.

Figure 4:
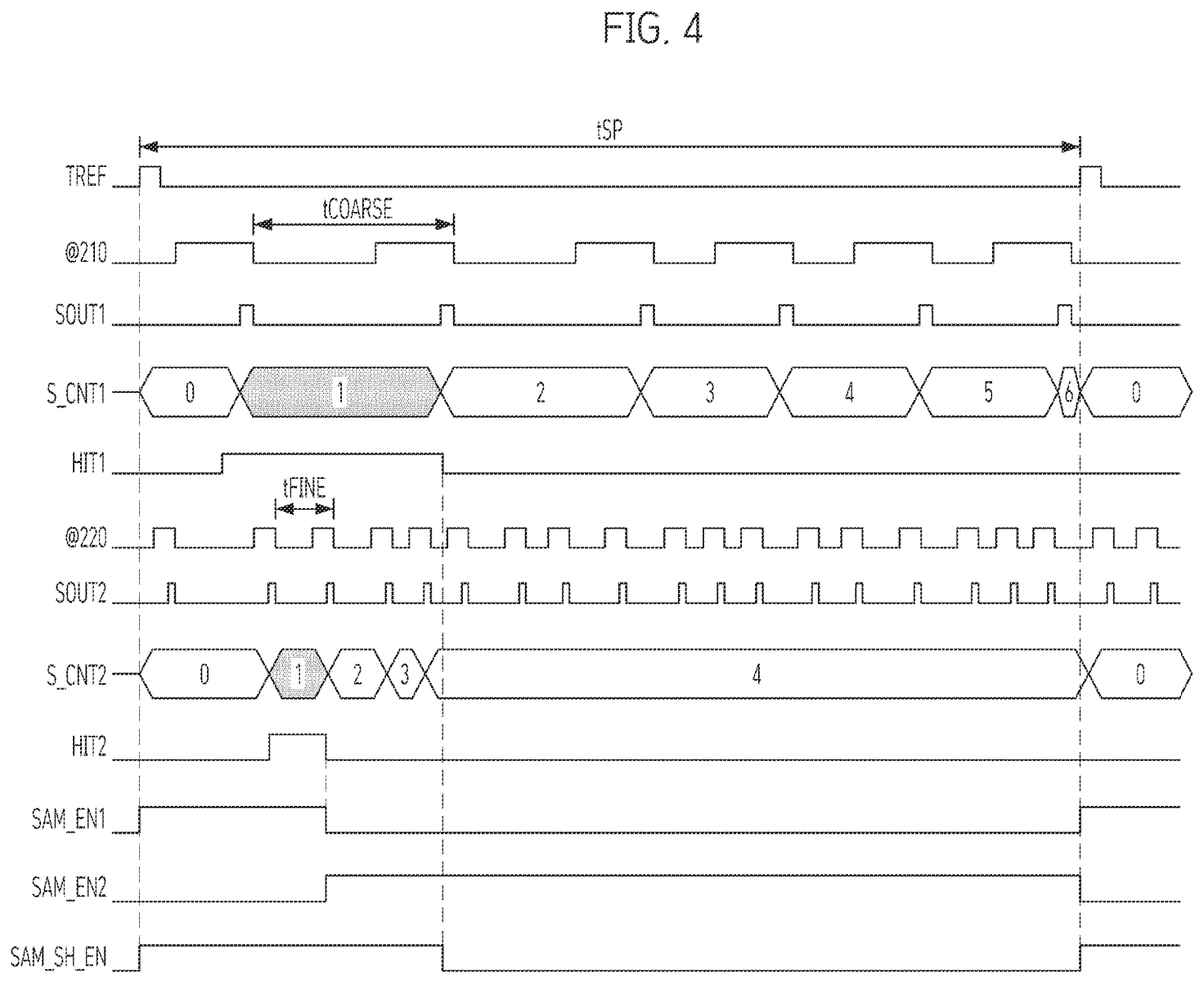

FIG. 4 is a timing diagram for describing an operation of the sampling control circuit 154 in accordance with an embodiment of the present disclosure.

Referring to FIG. 4, a section between adjacent target refresh commands TREF may be defined as one target refresh period tSP.

The first pattern generation circuit 210 may generate a first pattern signal SOUT1 randomly pulsing during the target refresh period tSP. The first pattern generation circuit 210 may divide the target refresh period tSP into a plurality of coarse sections tCOARSE having a random period (or length), and generate the first pattern signal SOUT1 pulsing for each coarse section. The second pattern generation circuit 220 may generate a second pattern signal SOUT2 randomly pulsing during the target refresh period tSP. The second pattern generation circuit 220 may divide the target refresh period tSP into a plurality of fine sections tFINE, and generate the second pattern signal SOUT2 pulsing for each fine section. The second pattern generation circuit 220 may generate the second pattern signal SOUT2 that randomly pulses at a period shorter than the first pattern signal SOUT1.

The first section control circuit 230 may generate a first count value S_CNT1 by counting the number of toggling of the first pattern signal SOUT1, and generate a reference count value (e.g., 1) by counting the number of inputs of the target refresh command TREF. The first section control circuit 230 may activate a coarse section signal HIT1 when the first count value S_CNT1 is identical to the reference count value. The second section control circuit 240 may generate a second count value S_CNT2 by counting the number of toggling of the second pattern signal SOUT2, and activate a fine section signal HIT2 when the second count value S_CNT2 is identical to the reference count value. That is, an activated section of the fine section signal HIT2 may be sampled within an activated section of the coarse section signal HIT1.

The control signal generation circuit 250 may set a first sampling control signal SAM_EN1 and a third sampling control signal SAM_SH_EN to a logic high level, according to a rising edge of the target refresh command TREF at which the target refresh period tSP starts. The control signal generation circuit 250 may reset the first sampling control signal SAM_EN1 to a logic low level while setting a second sampling control signal SAM_EN2 to a logic high level, according to a falling edge of the fine section signal HIT2. The control signal generation circuit 250 may reset the third sampling control signal SAM_SH_EN to a logic low level according to a falling edge of the coarse section signal HIT1. According to a rising edge of the target refresh command TREF after the target refresh period tSP ends, the control signal generation circuit 250 may reset the second sampling control signal SAM_EN2 to a logic low level.

As described above, in the embodiment of the present disclosure, during the target refresh period tSP, the first sampling control signal SAM_EN1 and the second sampling control signal SAM_EN2 are mutually exclusively activated based on the selected fine sections, and the third sampling control signal SAM_SH_EN may cover a section in which the first sampling control signal SAM_EN1 and the second sampling control signal SAM_EN2 overlap. Accordingly, the randomization can be maximized by enabling sampling for the entire range of the sampling period (i.e., the target refresh period tSP).

Hereinafter, referring to FIGS. 5 to 8, a detailed configuration and operation of each component of the sampling circuit 156 will be described.

Figure 5:
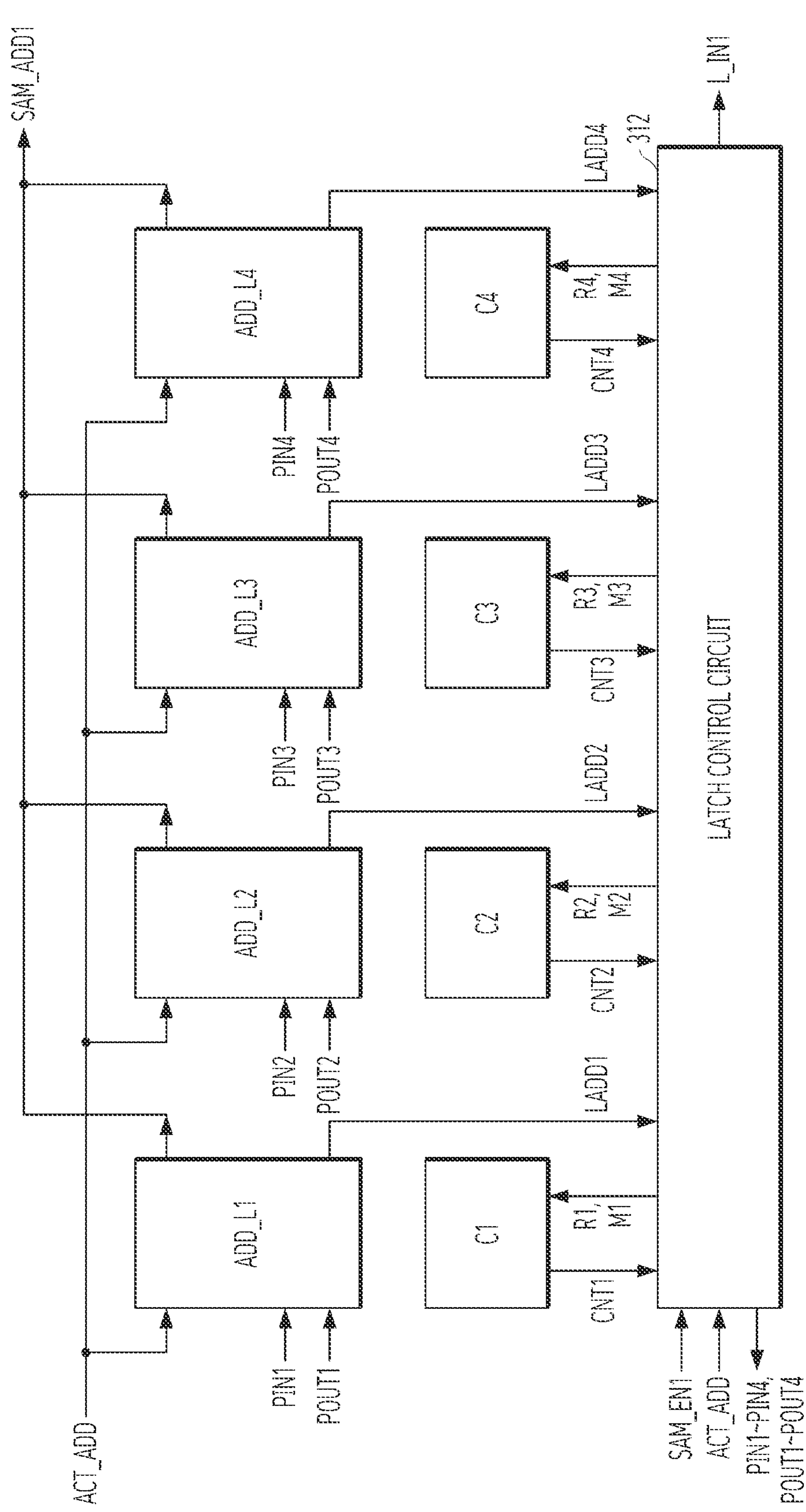
FIG. 5 is a diagram illustrating a detailed configuration of a first storage circuit of FIG. 2.

FIG. 5 is a diagram illustrating a detailed configuration of the first storage circuit 310 of FIG. 2.

Referring to FIG. 5, the first storage circuit 310 may include a latch control circuit 312, a plurality of address latches, and a plurality of counters. The plurality of address latches and the plurality of counters may correspond one-to-one. Hereinafter, a case where the first to fourth address latches ADD_L1 to ADD_L4 and the first to fourth counters C1 to C4 are disposed will be described as an example.

The latch control circuit 312 may receive the first sampling control signal SAM_EN1, the active address ACT_ADD, first to fourth latch addresses LADD1 to LADD4, and first to fourth count signals CNT1 to CNT4, and output first to fourth match signals M1 to M4, first to fourth reset signals R1 to R4, first to fourth latch input signals PIN1 to PIN4, and first to fourth latch output signals POUT1 to POUT4. When one of the first to fourth latch output signals POUT1 to POUT4 is activated, the latch control circuit 312 may activate the first input control signal L_IN1 and provide the first input control signal L_IN1 to the output control circuit 340.

The first to fourth address latches ADD_L1 to ADD_L4 may store the active address ACT_ADD as the first to fourth latch addresses LADD1 to LADD4 in response to the first to fourth latch input signals PIN1 to PIN4, and output the first sampling address SAM_ADD1 in response to the first to fourth latch output signals POUT1 to POUT4, respectively. For example, the first address latch ADD_L1 may store the active address ACT_ADD1 as the first latch input signal PIN1 when the first latch input signal PIN1 is activated, and output the stored first latch address LADD1 as the first sampling address SAM_ADD1 when the first latch output signal POUT1 is activated. The first to fourth address latches ADD_L1 to ADD_L4 may provide the first to fourth latch addresses LADD1 to LADD4 to the latch control circuit 312.

The first to fourth counters C1 to C4 may increase values of the first to fourth count signals CNT1 to CNT4 according to the first to fourth match signals M1 to M4, and initialize the first to fourth count signals CNT1 to CNT4 according to the first to fourth reset signals R1 to R4, respectively. For example, the first counter C1 may increase the value of the first count signal CNT1 by "+1" when the first match signal M1 is activated, and initialize the value of the first count signal CNT1 to "0" when the first reset signal R1 is activated. The first to fourth counters C1 to C4 may provide the first to fourth count signals CNT1 to CNT4 to the latch control circuit 312.

Figure 6:
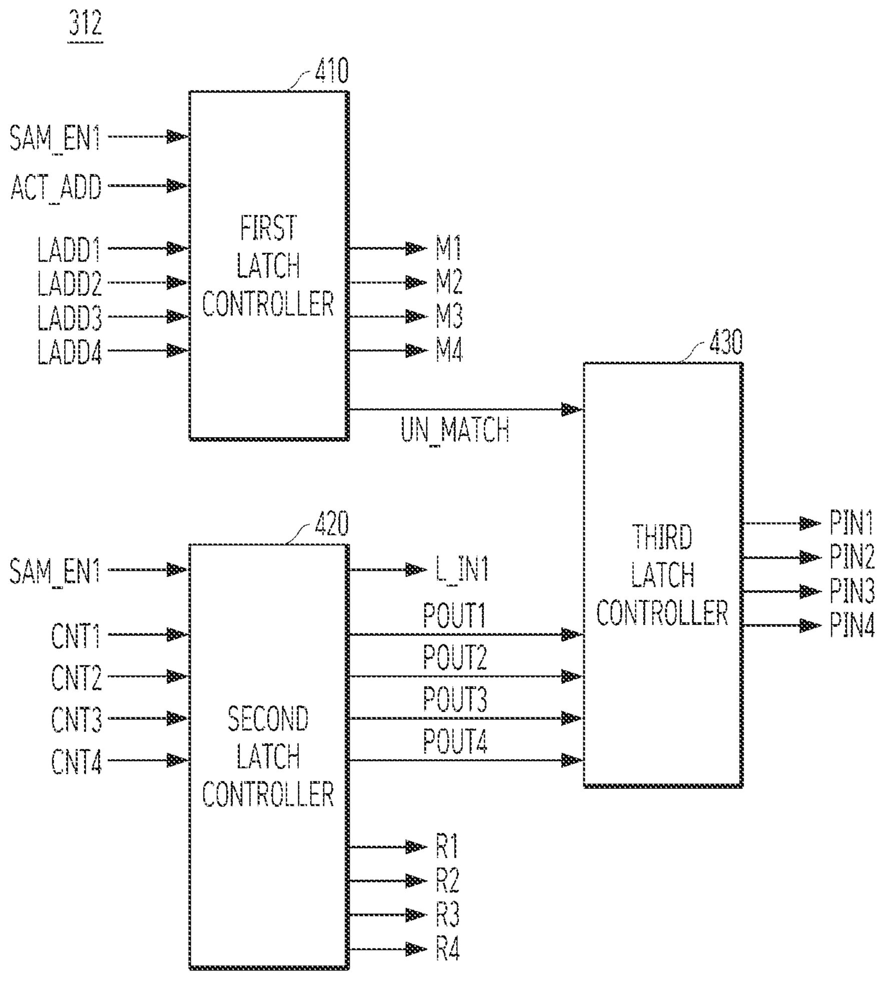
FIG. 6 is a diagram illustrating a detailed configuration of a latch enable circuit of FIG. 5.

FIG. 6 is a diagram illustrating a detailed configuration of the latch enable circuit 312 of FIG. 5.

Referring to FIG. 6, the latch enable circuit 312 may include first to third latch controllers 410 to 430.

The first latch controller 410 may compare the active address ACT_ADD with the first to fourth latch addresses LADD1 to LADD4 according to the first sampling control signal SAM_EN1 to generate the first to fourth match signals M1 to M4, respectively. For example, when the first sampling control signal SAM_EN1 is activated, the first latch controller 410 may compare the active address ACT_ADD with the first latch address LADD1 to activate the first match signal M1 when the active address ACT_ADD is identical to the first latch address LADD1. The first latch controller 410 may activate an un-match signal UM_MATCH when the active address ACT_ADD is different from all of the first to fourth latch addresses LADD1 to LADD4.

The second latch controller 420 may identify whether each value of the first to fourth count signals CNT1 to CNT4 is equal to or greater than a preset threshold value according to the first sampling control signal SAM_EN1 to generate the first to fourth latch output signals POUT1 to POUT4. In addition, the second latch controller 420 may selectively activate the first to fourth reset signals R1 to R4 according to the first to fourth latch output signals POUT1 to POUT4, and activate the first input control signal L_IN1 when one of the first to fourth reset signals R1 to R4 is activated. For example, when the first sampling control signal SAM_EN1 is activated, the second latch controller 420 may identify whether each value of the first to fourth count signals CNT1 to CNT4 is equal to or greater than the preset threshold value, to activate the first latch output signal POUT1 when it is determined that the first count signal CNT1 is equal to or greater than the preset threshold value. The first latch controller 410 may activate the first reset signal R1 and the first input control signal L_IN1 according when the first latch output signal POUT1 is activated.

The third latch controller 430 may generate the first to fourth latch input signals PIN1 to PIN4 in response to the un-match signal UM_MATCH and the first to fourth latch output signals POUT1 to POUT4. The third latch controller 430 may determine an empty address latch based on the first to fourth latch output signals POUT1 to POUT4, and activate a latch input signal corresponding to the empty address latch when the un-match signal UM_MATCH is activated. For example, when the first latch output signal POUT1 is activated, the third latch controller 430 may determine that an invalid address is stored in the first address latch ADD_L1, that is, that the first address latch ADD_L1 is empty. After that, when the un-match signal UM_MATCH is activated, the third latch controller 430 may activate the first latch input signal PIN1 corresponding to the first address latch ADD_L1, to thereby control the first address ACT_ADD to be stored in the first address latch ADD_L1.

Referring to FIGS. 5 and 6, an operation of the first storage circuit 310 will be described as follows.

When the active address ACT_ADD is inputted while the first sampling control signal SAM_EN1 is activated, the address latches ADD_L1 to ADD_L4 may store the active address ACT_ADD as the first preliminary addresses (i.e., the first to fourth latch addresses LADD1 to LADD4). When the active address ACT_ADD is the same as one of the first preliminary addresses LADD1 to LADD4 stored in the address latches ADD_L1 to ADD_L4, a corresponding counter of the counters C1 to C4 may increase its count value. That is, the counters C1 to C4 may count the number of inputs of the first preliminary addresses LADD1 to LADD4, respectively. When one of the count values stored in the counters C1 to C4 is equal to or greater than the threshold value, the latch control circuit 312 may control a first preliminary address stored in a corresponding address latch to be outputted as the first sampling address SAM_ADD1.

That is, the first storage circuit 310 may store the active address ACT_ADD as the first preliminary addresses (i.e., the first to fourth latch addresses LADD1 to LADD4) according to the first sampling control signal SAM_EN1, and select the first sampling address SAM_ADD1 from the first preliminary addresses LADD1 to LADD4 based on the number of inputs of the first preliminary addresses LADD1 to LADD4, to output the sampling address SAM_ADD1 together with the first input control signal L_IN1.

The second storage circuit 320 may have the same configuration and perform the same operation as the first storage circuit 310 except for receiving the second sampling control signal SAM_EN2 and outputting the second sampling address SAM_ADD2 and the second input control signal L_IN2.

Figure 7:
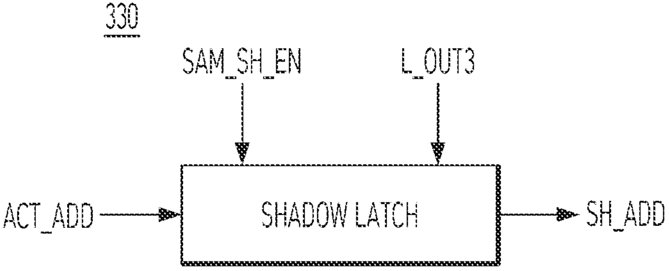
FIG. 7 is a diagram illustrating a detailed configuration of a shadow latch of FIG. 2.

FIG. 7 is a diagram illustrating a detailed configuration of the shadow latch 330 of FIG. 2.

Referring to FIG. 7, the shadow latch 330 may store the active address ACT_ADD according to the third sampling control signal SAM_SH_EN, to output the third sampling address SH_ADD according to the third output control signal L_OUT3. Since the shadow latch 330 overwrites the active address ACT_ADD during an activated section of the third sampling control signal SAM_SH_EN, the active address ACT_ADD finally stored according to the third output control signal L_OUT3 may be provided as the third sampling address SH_ADD.

Figure 8:
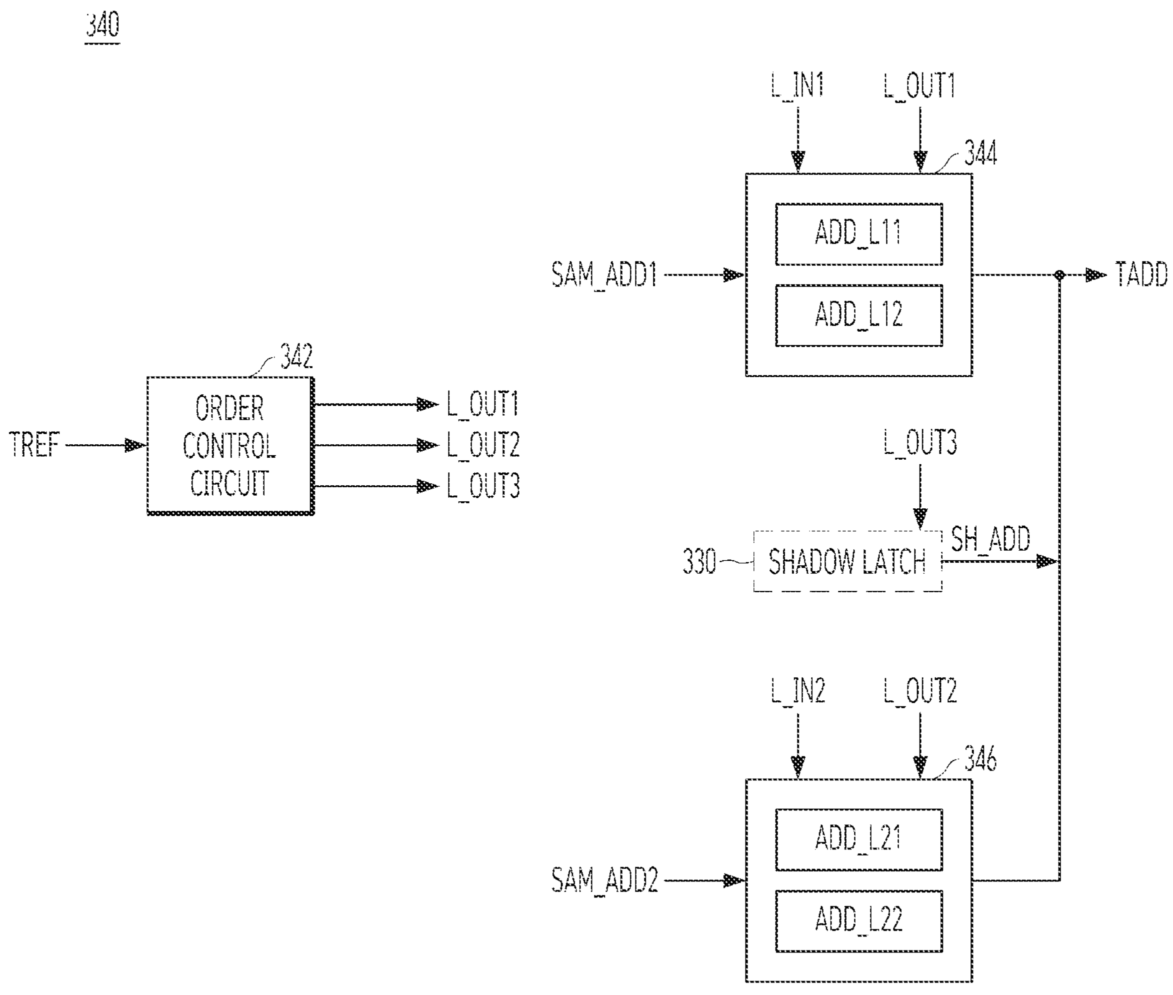
FIG. 8 is a diagram illustrating a detailed configuration of an output control circuit of FIG. 2.

FIG. 8 is a diagram illustrating a detailed configuration of the output control circuit 340 of FIG. 2.

Referring to FIG. 8, the output control circuit 340 may include an order control circuit 342, a first output latch circuit 344, and a second output latch circuit 346.

The order control circuit 342 may generate first to third output control signals L_OUT1 to L_OUT3 according to the target refresh command TREF. The order control circuit 342 may determine an activation order of the first to third output control signals L_OUT1 to L_OUT3 according to the number of inputs of the target refresh command TREF. For example, the order control circuit 342 may sequentially activate the first to third output control signals L_OUT1 to L_OUT3 once each time the target refresh command TREF is input. Alternatively, the order control circuit 342 may sequentially activate the first output control signal L_OUT1 twice, the second output control signal L_OUT2 twice, and the third output control signal L_OUT3 once each time the target refresh command TREF is input. The activation order of the first to third output control signals L_OUT1 to L_OUT3 may be variously changed according to embodiments.

The first output latch circuit 344 may sequentially store the first sampling address SAM_ADD1 according to the first input control signal L_IN1, and sequentially output the stored addresses as the target address TADD according to the first output control signal L_OUT1. The first output latch circuit 344 may be configured as a pipe latch circuit including a plurality of address latches. In FIG. 8, a case where the first output latch circuit 344 includes two address latches ADD_L11 and ADD_L12 is illustrated as an example, but the embodiments of the present disclosure are not limited thereto, and the first output latch circuit 344 may include two or more address latches.

The second output latch circuit 346 may sequentially store the second sampling address SAM_ADD2 according to the second input control signal L_IN2, and sequentially output the stored addresses as the target address TADD according to the second output control signal L_OUT2. The second output latch circuit 346 may be configured as a pipe latch circuit including a plurality of address latches. In FIG. 8, the case where the second output latch circuit 346 includes two address latches ADD_L21 and ADD_L22 is illustrated as an example, but the embodiments of the present disclosure are not limited thereto, and the second output latch circuit 346 may include two or more address latches.

The shadow latch 330 may provide the finally stored active address ACT_ADD as the third sampling address SH_ADD according to the third output control signal L_OUT3.

With the above configuration, the output control circuit 340 may sequentially store the first and second sampling addresses SAM_ADD1 and SAM_ADD2, and output the target address TADD by scheduling the first and second sampling addresses SAM_ADD1 and SAM_ADD2 and the third sampling addresses SH_ADD2 according to the number of inputs of the target refresh command TREF.

Figure 9:
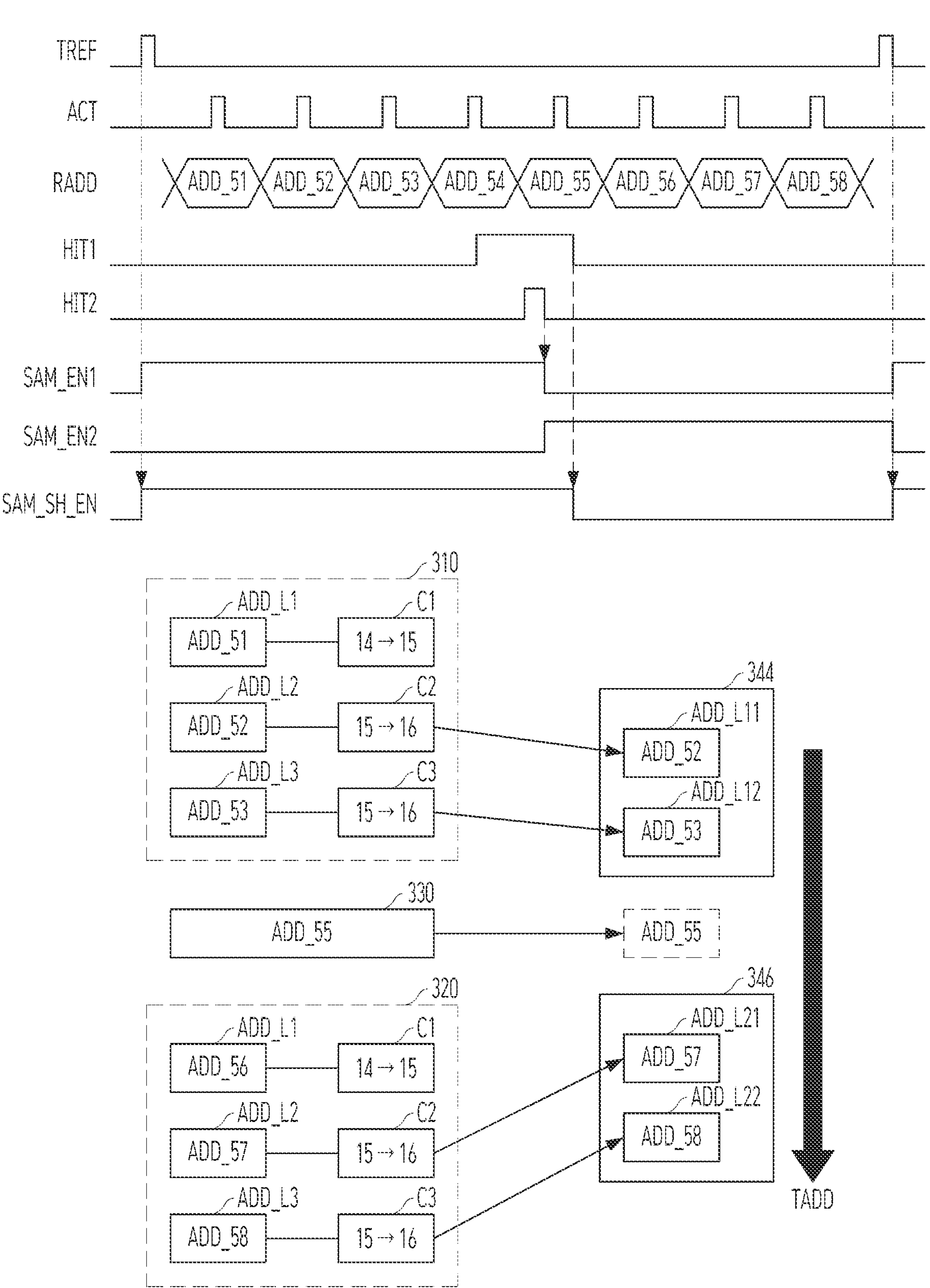
FIG. 9 is a diagram for describing an operation of the sampling circuit in accordance with an embodiment of the present disclosure.

FIG. 9 is a diagram for describing an operation of the sampling circuit 156 in accordance with an embodiment of the present disclosure. For convenience of description, in FIG. 9, the first storage circuit 310 and the second storage circuit 320 each have three address latches and counters, and the first output latch circuit 344 and the second output latch circuit 346 each have two address latches.

Referring to FIG. 9, the target command generation circuit 140 may generate a target refresh command TREF whenever the number of inputs of the normal refresh command REF reaches a preset number of times. A target refresh period may be started by the target refresh command TREF.

The sampling control circuit 154 may randomly select one coarse section according to the target refresh command TREF and the first pattern signal SOUT1, and generate a coarse section signal HIT1 that designates the selected coarse section. In addition, the sampling control circuit 154 may randomly select one fine section according to the target refresh command TREF and the second pattern signal SOUT2 during the selected coarse section, and generate a fine section signal HIT2 that designates the selected fine section. The sampling control circuit 154 may generate a first sampling control signal SAM_EN1 and a second sampling control signal SAM_EN2 having activated sections separated from each other by a falling edge of the fine section signal HIT2, and generate a third sampling control signal SAM_SH_EN having an activated section defined by a falling edge of the coarse section signal HIT1.

The first storage circuit 310 may be operated during an activated section of the first sampling control signal SAM_EN1. In this case, during a previous target refresh period, a 51-th row address ADD_51 has been inputted 14 times so that the count value "14" is stored in the first counter C1, and a 52-th row address ADD_52 and a 53-th row address ADD_53 have been inputted 15 times so that the count value "15" is stored in the second counter C2 and the third counter C3, respectively.

When the 51-th row address ADD_51 is inputted together with an active command ACT during the activated section of the first sampling control signal SAM_EN1, the first storage circuit 310 may store the 51-th row address ADD_51 in the first address latch ADD_L1 and increase the count value of the first counter C1 to "15". After that, when the 52-th row address ADD_52 is inputted together with the active command ACT, the first storage circuit 310 may store the 52-th row address ADD_52 in the second address latch ADD_L2 and increase the count value of the second counter C2 to "16". In this case, a threshold value is set to 16, the first storage circuit 310 may provide the 52-th row address ADD_52 stored in the second address latch ADD_L2 as the first sampling address SAM_ADD1, and the first output latch circuit 344 may store the first sampling address SAM_ADD1 in the address latch ADD_L11. Thereafter, when the 53-th row address ADD_53 is inputted together with the active command ACT, the first storage circuit 310 may store the 53-th row address ADD_53 in the third address latch ADD_L3 and increase the count value of the third counter C3 to "16". The first storage circuit 310 may provide the 53-th row address ADD_53 stored in the third address latch ADD_L3 as the first sampling address SAM_ADD1, and the first output latch circuit 344 may store the first sampling address SAM_ADD1 in the address latch ADD_L12. For reference, even when a 54-th row address ADD_54 is inputted, since all address latches are in use, the first storage circuit 310 does not store the 54-th row address ADD_54.

During an activated section of the third sampling control signal SAM_SH_EN, the shadow latch 330 may sequentially overwrite the 52-th row address ADD_51, the 53-th row address ADD_52, the 54-th row address ADD_53, the row address ADD_54, and a 55-th row address ADD_55. Accordingly, the shadow latch 330 may finally store the 55-th row address ADD_55.

The second storage circuit 320 may be operated during an activated section of the second sampling control signal SAM_EN2 after the first sampling control signal SAM_EN1 is deactivated. In this case, during a previous target refresh period, a 56-th row address ADD_56 has been input 14 times so that the count value "14" is stored in the first counter C1, and a 57-th row address ADD_57 and a 58-th row address ADD_58 have been input 15 times so that the count value "15" is stored in the second counter C2 and the third counter C3, respectively. During the activated section of the second sampling control signal SAM_EN2, the 56-th row address ADD_56, the 57-th row address ADD_57, and the 58-th row address ADD_58 are input together with the active command ACT. The second storage circuit 320 may store the 56-th row address ADD_56, the 57-th row address ADD_57, and the 58-th row address ADD_58 in the first to third address latches ADD_L1 to ADD_L3, respectively, and increase the count values of the first to third counters C1 to C3 to "15", "16", and "16", respectively. Accordingly, the second storage circuit 320 may sequentially provide the 57-th row address ADD_57 and the 58-th row address ADD_58 as the second sampling address SAM_ADD2, and the second output latch circuit 346 may sequentially store the second sampling address SAM_ADD2 in the address latches ADD_L21 and ADD_L22.

After that, when the target refresh command TREF is input, the addresses stored in the first output latch circuit 344, the shadow latch 330, and the second output latch circuit 346 may be output as the target address TADD in the order determined by the order control circuit 342.

As described above, in accordance with the embodiment of the present disclosure, in the memory device performing the target refresh operation by sampling addresses based on probability, the randomization can be maximized by enabling sampling for the entire range of the sampling period. In addition, it is possible to eliminate the periodicity of the sampling circuit and improve the efficiency of the target refresh operation by performing sampling using dual pattern generation circuits operating at different periods/cycles.

In the above embodiment, the case where the target refresh operation is performed according to the target refresh command TREF generated internally has been described as an example, but recently a target refresh operation is also performed according to a refresh management command RFM provided from an external device (e.g., a memory controller).

Figure 10:
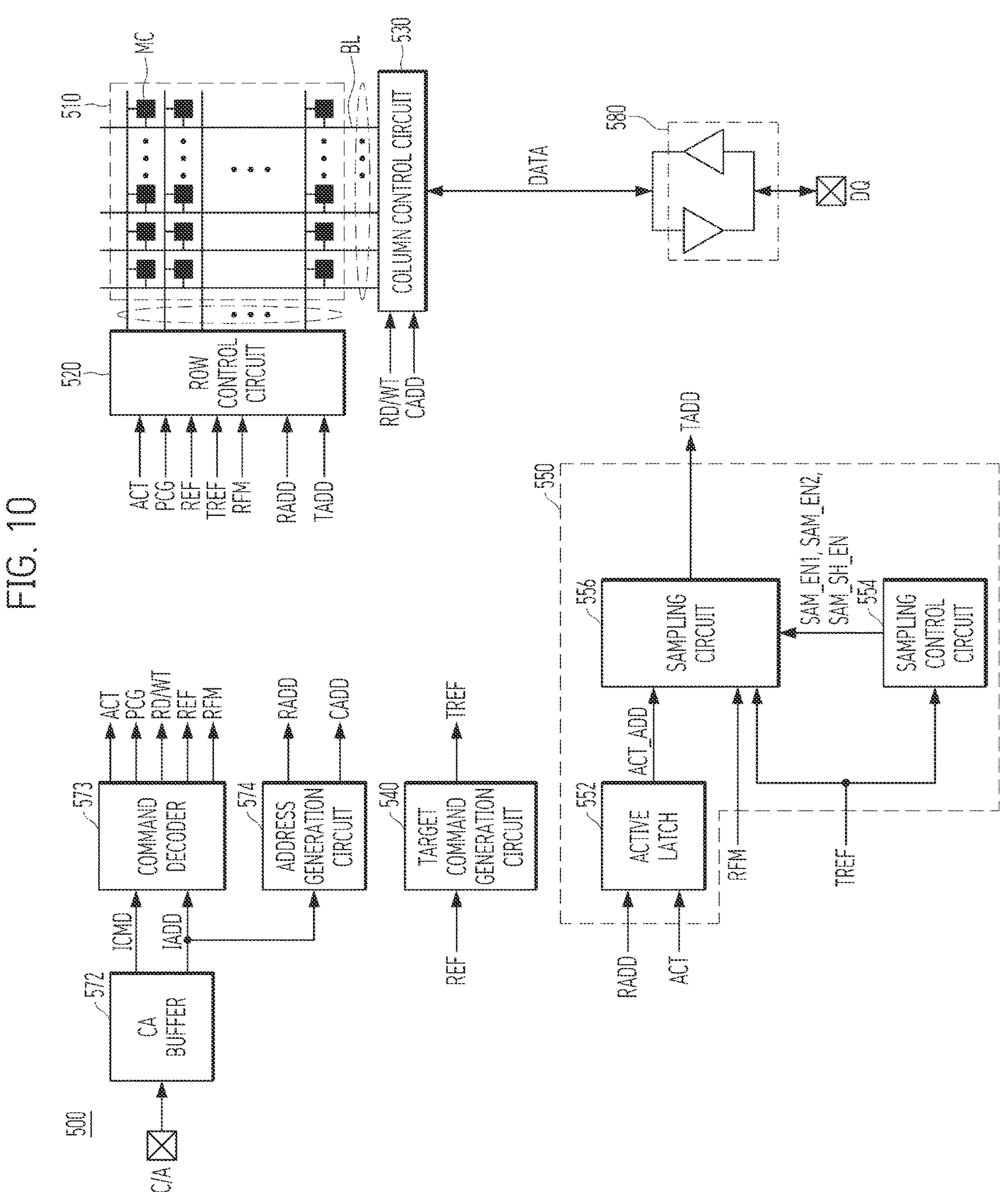
FIG. 10 is a block diagram illustrating a memory device in accordance with another embodiment of the present disclosure.

FIG. 10 is a block diagram illustrating a memory device 500 in accordance with another embodiment of the present disclosure.

Referring to FIG. 10, the memory device 500 may include a memory cell region 510, a row control circuit 520, a column control circuit 530, a target command generation circuit 540, a refresh control circuit 550, a command/address (CA) buffer 572, a command decoder 573, an address generation circuit 574, and a data input/output circuit 580. The memory cell region 510, the column control circuit 530, the target command generation circuit 540, the CA buffer 572, the address generation circuit 574, and the data input/ output circuit 580 of FIG. 10 may have substantially the same configuration as those of FIG. 1.

The command decoder 573 may decode an internal command ICMD output from the CA buffer 572 to generate an active command ACT, a precharge command PCG, a read command RD, and a write command WT. Further, the command decoder 573 may decode the internal command ICMD to generate a normal refresh command REF which is periodically activated, and a refresh management command RFM which is non-periodically activated. That is, the refresh management command RFM may be a command provided from the memory controller for a target refresh operation, and the target refresh command TREF may be a command generated by the memory device 500 itself for a target refresh operation.

The row control circuit 520 may be coupled to a plurality of memory cells MC of the memory cell region 510 through a plurality of rows WL. The row control circuit 520 may select or activate at least one row selected by the row address RADD when the active command ACT is input and deactivate the activated row when the precharge command PCG is input. The row control circuit 520 may perform a normal refresh operation of sequentially refreshing the plurality of rows WL corresponding to a counted address according to the normal refresh command REF. The row control circuit 520 may perform a target refresh operation of refreshing at least one adjacent row corresponding to the target address TADD according to the target refresh command TREF or the refresh management command RFM.

The refresh control circuit 550 may generate first to third sampling control signals SAM_EN1, SAM_EN2, and SAM_ SH_EN, which are randomly activated during a target refresh period. The refresh control circuit 550 may latch an internal address IADD as an active address ADD_ ACT in response to the active command ACT, and store a plurality of sampling addresses by randomly sampling the active addresses ADD_ACT in response to the first to third sampling control signals SAM_EN1, SAM_EN2, and SAM_ SH_EN. The refresh control circuit 550 may output a target address TADD by selecting one of the plurality of sampling addresses according to the target refresh command TREF or the refresh management command RFM.

In detail, the refresh control circuit 550 may include an active latch 552, a sampling control circuit 554, and a sampling circuit 556. The active latch 552 and the sampling control circuit 554 of FIG. 10 may have substantially the same configurations as those of FIG. 1.

The sampling circuit 556 may store first to third sampling addresses by sampling the active addresses ADD_ACT according to the first to third sampling control signals SAM_EN1, SAM_EN2, and SAM_SH_EN, respectively, and output the target address TADD by scheduling the first to third sampling addresses according to the target refresh command TREF or the refresh management command RFM. According to an embodiment, the sampling circuit 556 may include a first storage circuit 310, a second storage circuit 320, a shadow latch 330, and an output control circuit 340 illustrated in FIG. 2. The sampling circuit 556 may have substantially the same configuration as the sampling circuit 156 of FIG. 1, except that the output control circuit 340 outputs the target address TADD by scheduling the first to third sampling addresses SAM_ADD1, SAM_ADD2, and SH_ADD according to the target refresh command TREF or the refresh management command RFM.

Hereinafter, an output control circuit included in the sampling circuit 556 will be described.

Figure 11:
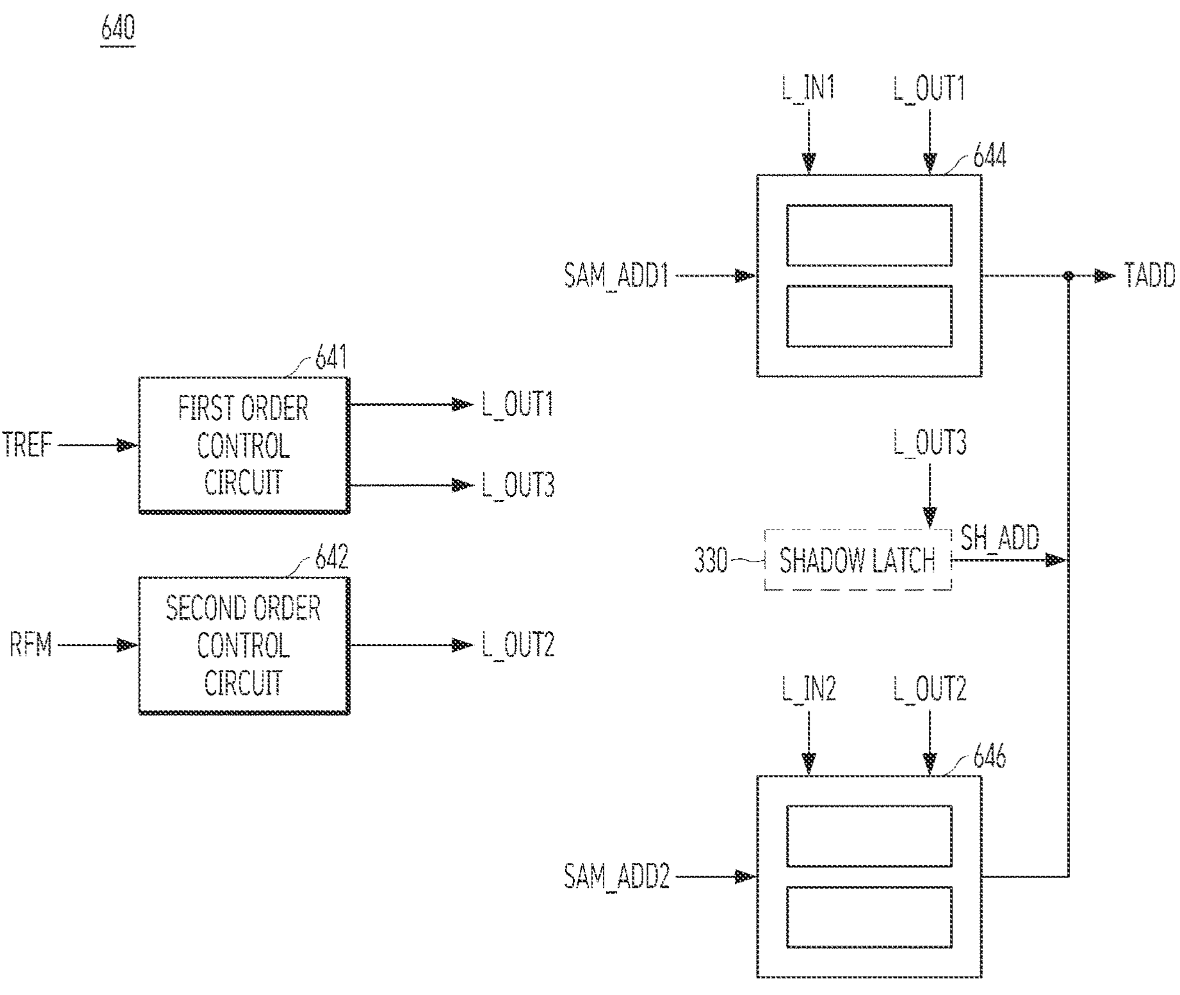
FIG. 11 is a diagram illustrating a detailed configuration of an output control circuit of a sampling circuit of FIG. 10.

FIG. 11 is a diagram illustrating a detailed configuration of an output control circuit 640 of the sampling circuit 556 of FIG. 10.

Referring to FIG. 11, the output control circuit 640 may include a first order control circuit 641, a second order control circuit 642, a first output latch circuit 644, and a second output latch circuit 646.

The first order control circuit 641 may generate first and third output control signals L_OUT1 and L_OUT3 according to the target refresh command TREF. The first order control circuit 641 may determine an activation order of the first and third output control signals L_OUT1 and L_OUT3 according to the number of inputs of the target refresh command TREF. For example, the first order control circuit 641 may sequentially activate the first and third output control signals L_OUT1 and L_OUT3 once each time the target refresh command TREF is input. Alternatively, the first order control circuit 641 may sequentially activate the first output control signal L_OUT1 twice, and the third output control signal L_OUT3 once each time the target refresh command TREF is input.

The second order control circuit 642 may generate a second third output control signal L_OUT2 according to the refresh management command RFM. For example, the second order control circuit 642 may activate the second third output control signal L_OUT2 each time the target refresh command TREF is input. Alternatively, the first order control circuit 641 may activate the second third output control signal L_OUT2 whenever the refresh management command RFM is input a predetermined number of times.

The first output latch circuit 644 and the second output latch circuit 646 may have substantially the same configuration as the first output latch circuit 644 and the second output latch circuit 646, and perform substantially the same operation as those of FIG. 8.

With the above configuration, the output control circuit 640 may sequentially store the first and second sampling addresses SAM_ADD1 and SAM_ADD2, and output the target address TADD by scheduling the first and second sampling addresses SAM_ADD1 and SAM_ADD2 and the third sampling addresses SH_ADD according to the target refresh command TREF and the refresh management command RFM.

Furthermore, the embodiments of the present disclosure are not limited thereto, and the first to third output control signals L_OUT1 to L_OUT3 may be generated in various ways according to the target refresh command TREF and the refresh management command RFM. For example, the first order control circuit 641 may generate the first output control signal L_OUT1 according to the target refresh command TREF, and the second order control circuit 642 may generate the second and third output control signals L_OUT2 and L_OUT3 according to the refresh management command RFM.

Figure 12:
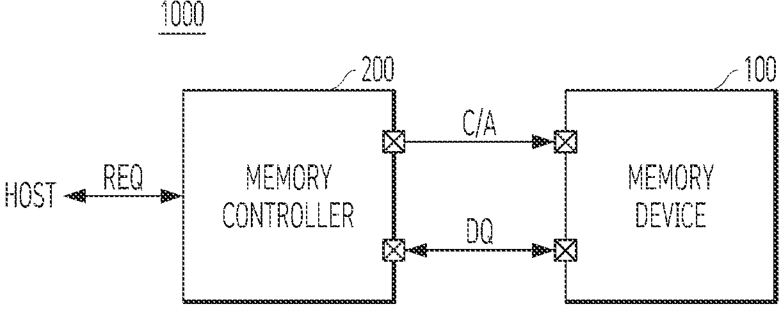
FIG. 12 is a block diagram illustrating a memory system in accordance with an embodiment of the present disclosure.

FIG. 12 is a block diagram illustrating a memory system 1000 in accordance with an embodiment of the present disclosure.

Referring to FIG. 12, the memory system 1000 include a memory device 100 and a memory controller 200.

The memory controller 200 may control an overall operation of the memory system 1000 and control an overall data communication between a host (i.e., an external device) and the memory device 100. The memory controller 200 may generate a command/address signal (C/A) in response to a request REQ from the host and provide it to the memory device 100. According to an embodiment, the memory controller 200 may provide a clock to the memory device 100 together with the command/address signal C/A. The memory controller 200 may provide data DQ corresponding to the request REQ provided from the host to the memory device 100. The memory controller 200 may provide the data DQ read from the memory device 100 to the host.

The command/address signal C/A provided from the memory controller 200 to the memory device 100 may include an active command ACT, a precharge command PCG, a normal refresh command REF, a refresh management command RFM, a read command RD, and a write command WT. The memory controller 200 may apply the normal refresh command REF indicating a normal refresh operation between operations requested by the host. The memory controller 200 may apply the normal refresh command REF so that all rows are normally refreshed within a refresh window (tREFW) defined in a specification. In addition, the memory controller 200 may issue the refresh management command RFM at each time interval defined in the specification, or whenever the number of issuances of active commands ACT reaches a number of times defined in the specification.

The memory device 100 may have substantially the same configuration as the memory device 10 of FIG. 1 or the memory device 500 of FIG. 10. That is, in an embodiment of the present disclosure, the memory device 100 may generate a target refresh command TREF that defines a target refresh period according to the normal refresh command REF. The memory device 100 may select a coarse section from a plurality of coarse sections according to a first pattern signal during the target refresh period, select a fine section from a plurality of fine sections according to a second pattern signal during the selected coarse section, generate first to third sampling control signals having active sections defined by the selected coarse section and the selected fine section, generate first to third sampling addresses by sampling a row address according to the first to third sampling control signals, respectively, and output a target address by scheduling the first to third sampling addresses according to the target refresh command TREF or the refresh management command RFM. The memory device 100 may refresh rows corresponding to the target address according to the target refresh command TREF or the refresh management command RFM. Accordingly, the embodiments of the present disclosure can maximize the randomization by enabling sampling for the entire range of a sampling period (i.e., the target refresh period).

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the present disclosure and the following claims.

For example, for the logic gates and transistors provided as examples in the above-described embodiments, different positions and types may be implemented depending on the polarity of the input signal.

What is claimed is:

1. A semiconductor device comprising:

a sampling control circuit configured to
- select a coarse section from a plurality of coarse sections according to a first pattern signal during a sampling period,
- select a fine section from a plurality of fine sections according to a second pattern signal during the selected coarse section, and
- generate first to third sampling control signals having activated sections defined by the selected coarse section and the selected fine section; and a sampling circuit configured to
- sample an input address according to the first to third sampling control signals, respectively, to generate first to third sampling addresses, and
- schedule the first to third sampling addresses according to a sampling signal defining the sampling period to output an output address.

2. The semiconductor device of claim 1, wherein, during the sampling period, the sampling control circuit generates the first sampling control signal and the second sampling control signal having the activated sections separated from each other by the selected fine section, and wherein, during the sampling period, the sampling control circuit generates the third sampling control signal having the activated section defined by the selected coarse section.

3. The semiconductor device of claim 1, wherein the sampling control circuit includes:

a first section control circuit configured to randomly select the coarse section from the plurality of coarse sections according to the sampling signal and the first pattern signal;

a second section control circuit configured to randomly select the fine section from the plurality of fine sections according to the sampling signal and the second pattern signal during the selected coarse section; and a control signal generation circuit configured to generate the first sampling control signal and the second sampling control signal having the activated sections separated from each other by the selected fine section, and generate the third sampling control signal having the activated section defined by the selected coarse section.

4. The semiconductor device of claim 3, wherein the first section control circuit generates a coarse section signal designating the selected coarse section by comparing a first count value generated by counting the first pattern signal with a reference count value generated by counting the sampling signal.

5. The semiconductor device of claim 4, wherein the second section control circuit generates a fine section signal designating the selected fine section by comparing a second count value generated by counting the second pattern signal with the reference count value.

6. The semiconductor device of claim 3, wherein the control signal generation circuit includes:

a first signal generator configured to generate the first sampling control signal that is set according to the sampling signal and reset according to a fine section signal designating the selected fine section;

a second signal generator configured to generate the second sampling control signal that is set according to the fine section signal and reset according to the sampling signal; and a third signal generator configured to generate the third sampling control signal that is set according to the sampling signal and reset according to a coarse section signal designating the selected coarse section.

7. The semiconductor device of claim 1, further comprising:

a first pattern generation circuit configured to generate the first pattern signal randomly pulsing during the sampling period; and a second pattern generation circuit configured to generate the second pattern signal randomly pulsing at a period shorter than the first pattern signal, during the sampling period.

8. The semiconductor device of claim 1, wherein the sampling circuit includes:

a first storage circuit configured to receive and store the input address as one of a plurality of first preliminary addresses according to the first sampling control signal, and select one of the first preliminary addresses based on a number of inputs of the first preliminary addresses to output the first sampling address;

a second storage circuit configured to receive and store the input address as one of a plurality of second preliminary addresses according to the second sampling control signal, and select one of the second preliminary addresses based on a number of inputs of the second preliminary addresses to output the second sampling address;

a shadow latch configured to store the input address as the third sampling address according to the third sampling control signal; and an output control circuit configured to output the output address by scheduling the first to third sampling addresses according to the sampling signal.

9. The semiconductor device of claim 8, wherein the first storage circuit includes:

a plurality of address latches configured to store the input address as one of the plurality of first preliminary addresses according to the first sampling control signal;

a plurality of counters configured to respectively count the number of inputs of the first preliminary addresses; and a latch control circuit configured to control a corresponding first preliminary address to be output as the first sampling address when one of count values of the plurality of counters is equal to or greater than a threshold value.

10. The semiconductor device of claim 8, wherein the second storage circuit includes:

a plurality of address latches configured to store the input address as one of the plurality of second preliminary addresses according to the second sampling control signal;

a plurality of counters configured to respectively count the number of inputs of the second preliminary addresses; and a latch control circuit configured to control a corresponding second preliminary address to be output as the second sampling address when one of count values of the plurality of counters is equal to or greater than a threshold value.

11. The semiconductor device of claim 8, wherein the output control circuit includes:

an order control circuit configured to determine an activation order of first to third output control signals according to a number of inputs of the sampling signal;

a first output latch circuit configured to sequentially store the first sampling address to sequentially output the output address according to the first output control signal; and a second output latch circuit configured to sequentially store the second sampling address to sequentially output the output address according to the second output control signal, and wherein the shadow latch is configured to output the third sampling address as the output address, according to the third output control signal.

12. A semiconductor device comprising:

a sampling control circuit configured to generate a first pattern signal and a second pattern signal, which randomly pulse at different periods according to a sampling signal, and generate first to third sampling control signals based on the first pattern signal and the second pattern signal;

a first storage circuit configured to store an input address as one of a plurality of first preliminary addresses according to the first sampling control signal to generate a first sampling address;

a second storage circuit configured to store the input address as one of a plurality of second preliminary addresses according to the second sampling control signal to generate a second sampling address;

a shadow latch configured to latch the input address as a third sampling address according to the third sampling control signal; and an output control circuit configured to output an output address by selecting one of the first to third sampling addresses according to the sampling signal.

13. The semiconductor device of claim 12, wherein the sampling control circuit includes:

a first section control circuit configured to randomly select a coarse section from a plurality of coarse sections divided by the first pattern signal, according to the sampling signal;

a second section control circuit configured to randomly select a fine section from a plurality of fine sections divided by the second pattern signal according to the sampling signal and the second pattern signal, during the selected coarse section; and a control signal generation circuit configured to generate the first sampling control signal and the second sampling control signal having activated sections separated from each other by the selected fine section, and generate the third sampling control signal having an activated section defined by the selected coarse section.

14. The semiconductor device of claim 12, wherein the first storage circuit includes:

a plurality of address latches configured to store the input address as one of the plurality of first preliminary addresses according to the first sampling control signal;

a plurality of counters configured to respectively count the number of inputs of the first preliminary addresses; and a latch control circuit configured to control a corresponding first preliminary address to be output as the first sampling address when one of count values of the counters is equal to or greater than a threshold value.

15. The semiconductor device of claim 12, wherein the second storage circuit includes:

a plurality of address latches configured to store the input address as one of the plurality of second preliminary addresses according to the second sampling control signal;

a plurality of counters configured to respectively count the number of inputs of the second preliminary addresses; and a latch control circuit configured to control a corresponding second preliminary address to be output as the second sampling address when one of count values of the counters is equal to or greater than a threshold value.

16. The semiconductor device of claim 12, wherein the output control circuit includes:

an order control circuit configured to determine an activation order of first to third output control signals according to a number of inputs of the sampling signal;

a first output latch circuit configured to sequentially store the first sampling address to sequentially output the output address according to the first output control signal; and a second output latch circuit configured to sequentially store the second sampling address to sequentially output the output address according to the second output control signal, and wherein the shadow latch is configured to output the third sampling address as the output address, according to the third output control signal.

* * * * *